US012610690B2

(12) United States Patent　(10) Patent No.:　US 12,610,690 B2
Choi et al.　(45) Date of Patent:　Apr. 21, 2026

(54) DISPLAY APPARATUS WITH A THIN FILM TRANSISTOR HAVING RESISTANCES OF SOURCE AND DRAIN REGIONS LOWER THAN A RESISTANCE OF A CHANNEL REGION

(71) Applicant: LG Display Co., Ltd., Seoul (KR)

(72) Inventors: Sung Ju Choi, Paju-si (KR); Jae Yoon Park, Paju-si (KR); Jung Seok Seo, Paju-si (KR); Seo Yeon Im, Paju-si (KR); Jin Won Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 288 days.

(21) Appl. No.: 18/217,153

(22) Filed: Jun. 30, 2023

(65) Prior Publication Data

US 2024/0074235 A1　Feb. 29, 2024

(30) Foreign Application Priority Data

Aug. 31, 2022　(KR) ........................ 10-2022-0110188

(51) Int. Cl.
　*H10K 59/121*　(2023.01)
　*G09G 3/20*　(2006.01)
　*H10K 59/124*　(2023.01)
(52) U.S. Cl.
　CPC ........... *H10K 59/1213* (2023.02); *G09G 3/20* (2013.01); *H10K 59/124* (2023.02); *G09G 2300/0842* (2013.01)

(58) Field of Classification Search
　CPC ............. H10K 59/1213; H10K 59/124; H10K 59/126; G09G 3/20; G09G 2300/0842;
　(Continued)

(56) References Cited

U.S. PATENT DOCUMENTS 10,361,229 B2　7/2019　Yamaguchi et al.
2017/0323906 A1　11/2017　Yamaguchi et al.
(Continued)

FOREIGN PATENT DOCUMENTS

JP　H08-181325 A　7/1996
JP　2017-201665 A　11/2017
(Continued)

*Primary Examiner* — Tan N Tran
(74) *Attorney, Agent, or Firm* — Fenwick & West LLP

(57)　ABSTRACT

A display apparatus is provided. The display apparatus may include a light-emitting device and a pixel driving circuit electrically connected to the light-emitting device. The pixel driving circuit may supply a driving current corresponding to a data signal to the light-emitting device according to a gate signal. For example, the pixel driving circuit may include at least one thin film transistor. The thin film transistor may include an active pattern comprising an oxide semiconductor. A source region of the active pattern overlaps a source semiconductor pattern, and a drain region of the active pattern overlaps a drain semiconductor pattern. The source semiconductor pattern and the drain semiconductor pattern may include n-type impurities. A channel region of the active pattern may be outside the source semiconductor pattern and the drain semiconductor pattern. Thus, in the display apparatus, reliability of the pixel driving circuit may be improved.

14 Claims, 12 Drawing Sheets

(58) Field of Classification Search
CPC ........... H10D 30/6723; H10D 30/6755; H10D
86/40; H10D 86/423; H10D 86/60; H10D
86/421; H10H 29/142
See application file for complete search history.

(56) References Cited

U.S. PATENT DOCUMENTS

| | | | |
|---|---|---|---|
| 2018/0294286 A1 | 10/2018 | Yamaguchi et al. | |
| 2021/0376029 A1* | 12/2021 | Yuan .................. | H10D 30/6729 |
| 2024/0222445 A1* | 7/2024 | Huang ................... | H01L 21/34 |

FOREIGN PATENT DOCUMENTS

| | | |
|---|---|---|
| KR | 10-2014-0120542 A | 10/2014 |
| KR | 10-2019-0069952 A | 6/2019 |

* cited by examiner

DISPLAY APPARATUS WITH A THIN FILM TRANSISTOR HAVING RESISTANCES OF SOURCE AND DRAIN REGIONS LOWER THAN A RESISTANCE OF A CHANNEL REGION

CROSS-REFERENCE TO RELATED APPLICATIONS

This application claims the benefit of Republic of Korea Patent Application No. 10-2022-0110188, filed on Aug. 31, 2022, which is incorporated herein by reference in its entirety.

BACKGROUND

Technical Field

The present disclosure relates to a display apparatus in which an active pattern made of an oxide semiconductor is disposed in each pixel area.

Discussion of the Related Art

Generally, a display apparatus provides an image to a user. For example, the display apparatus may include a light-emitting device and a pixel driving circuit electrically connected to the light-emitting device. The light-emitting device may emit light displaying a specific color. For example, the light-emitting device may include a light-emitting layer disposed between a first electrode and a second electrode.

The pixel driving circuit may control the operation of the light-emitting device. For example, the pixel driving circuit of each pixel area may supply a driving current corresponding to a data signal to the light-emitting device according to a gate signal. The pixel driving circuit may include at least one thin film transistor. The thin film transistor may include an active pattern, a gate electrode, a source electrode and a drain electrode.

The active pattern may include a channel region overlapping with the gate electrode, a source region electrically connected to the source electrode, and a drain region electrically connected to the drain electrode. The channel region may be disposed between the source region and the drain region. For example, the source region and the drain region may have a resistance lower than the channel region.

The source region and the drain region may be formed by a process of etching a gate insulating layer disposed on the active pattern and the gate electrode or a process of doping with impurities. Thus, in the display apparatus, a surface of the active pattern may be physically damaged by an etching process of a doping process. And, in the display apparatus, the impurities of the source region and/or the drain region may diffuse toward the channel region by a subsequent process. That is, in the display apparatus, a width of the channel region may be reduced by the diffusion of the impurities. Therefore, in the display apparatus, the quality of the image may be degraded due to a change in electrical characteristics of the thin film transistor.

SUMMARY

Accordingly, the present disclosure is directed to a display apparatus that substantially obviates one or more problems due to limitations and disadvantages of the related art.

An object of the present disclosure is to provide a display apparatus capable of preventing or at least reducing the damage of the active pattern due to a process of forming the source region and the drain region.

Another object of the present disclosure is to provide a display apparatus capable of preventing or at least reducing a decrease in a width of the channel region due to the diffusion of the impurities used to form the source region and the drain region.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. A source semiconductor pattern, a drain semiconductor pattern, a first insulating layer, i.e. an intermediate insulating layer, and a thin film transistor are disposed on the device substrate. The source semiconductor pattern and the drain semiconductor pattern include n-type impurities. The drain semiconductor pattern is spaced apart from the source semiconductor pattern. The thin film transistor includes an active pattern. The active pattern is made of an oxide semiconductor pattern. The active pattern includes a source region overlapping with the source semiconductor pattern, a drain region overlapping with the drain semiconductor pattern, and a channel region between the source region and the drain region. The first insulating layer is disposed between the source semiconductor pattern and the active pattern and between the drain semiconductor pattern and the active pattern.

The source region and the drain region may have a material composition ratio same as the channel region. A resistance of the source region and a resistance of the drain region may be lower than a resistance of the channel region.

A second insulating layer, e.g., an upper gate insulating layer, may be disposed on the first insulating layer. The thin film transistor may include a gate electrode overlapping with the channel region of the active pattern. The gate electrode may be disposed on the second insulating layer. The active pattern may be surrounded by the first insulating layer and the second insulating layer.

The active pattern may be disposed between the device substrate and the gate electrode.

A buffer insulating layer may be disposed between the device substrate and the source semiconductor pattern and between the device substrate and the drain semiconductor pattern. A light-blocking pattern may be disposed between the device substrate and the buffer insulating layer. The light-blocking pattern may overlap the active pattern. The source semiconductor pattern and the drain semiconductor pattern may be electrically connected to the light-blocking pattern.

The thin film transistor may include a source electrode and a drain electrode. The source electrode may be electrically connected to the source region of the active pattern. The drain electrode may be electrically connected to the drain region of the active pattern. The light-blocking pattern may be electrically connected to the source electrode.

In another embodiment, there is provided a display device comprising a device substrate. A first insulating layer is disposed on the device substrate. A first thin film transistor is disposed on the first insulating layer. The first thin film transistor includes a first active pattern and a first gate electrode. The first active pattern is made of an oxide semiconductor. The first gate electrode overlaps a channel region of the first active pattern. A first source semiconductor pattern and a first drain semiconductor pattern are disposed between the device substrate and the first insulating layer. The first source semiconductor pattern overlaps a source region of the first active pattern. The first drain semiconductor pattern overlaps a drain region of the first active pattern. A second insulating layer is disposed on the first insulating layer. The second insulating layer extends between the first active pattern and the first gate electrode. The first source semiconductor pattern and the first drain semiconductor pattern include n-type impurities. The first gate electrode is electrically connected to the first source semiconductor pattern and the first drain semiconductor pattern.

The first drain semiconductor pattern may include same impurities as the first source semiconductor pattern.

A buffer insulating layer may be disposed between the device substrate and the first source semiconductor pattern and between the device substrate and the first drain semiconductor pattern. A first light-blocking pattern may be disposed between the device substrate and the buffer insulating layer. The first light-blocking pattern may overlap the first active pattern. The first light-blocking pattern may be electrically connected to the first gate electrode of the first thin film transistor.

The first light-blocking pattern may include a material different from the first source semiconductor pattern and the first drain semiconductor pattern.

A second thin film transistor spaced apart from the first thin film transistor may include a second active pattern and a second gate electrode. The second active pattern may be made of an oxide semiconductor. The second gate electrode may overlap a channel region of the second active pattern. A source region of the second active pattern may overlap a second source semiconductor pattern. A drain region of the second active pattern may overlap a second drain semiconductor pattern. The second source semiconductor pattern and the second drain semiconductor pattern may be insulated from the second active pattern. The second source semiconductor pattern and the second drain semiconductor pattern may include n-type impurities. The second gate electrode may be electrically connected to the second source semiconductor pattern and the second drain semiconductor pattern.

The second source semiconductor pattern and the second drain semiconductor pattern may be disposed between the buffer insulating layer and the first insulating layer.

The second gate electrode may be disposed between the device substrate and the buffer insulating layer.

The second gate electrode may be disposed on a layer different from the first light-blocking pattern.

A second light-blocking pattern may be disposed on the second insulating layer. The second light-blocking pattern may overlap the second active pattern. The second light-blocking pattern may include a same material as the first gate electrode.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings:

FIG. 3 is a view schematically showing a plane shape of a first thin film transistor and a second thin film transistor in the unit pixel area of the display apparatus according to the first embodiment of the present disclosure;

FIGS. 7 to 9 are views showing the display apparatus according to a second embodiment of the present disclosure;

DETAILED DESCRIPTION

Figure 1:
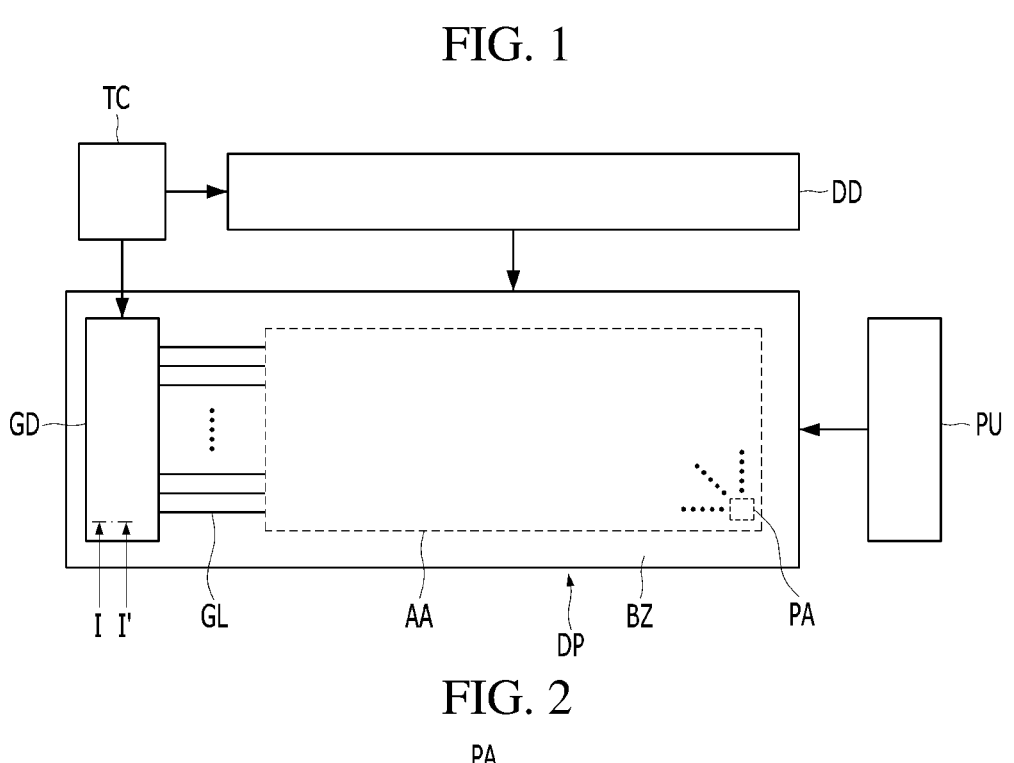
FIG. 1 is a view schematically showing a display apparatus according to a first embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical spirit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes"

specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
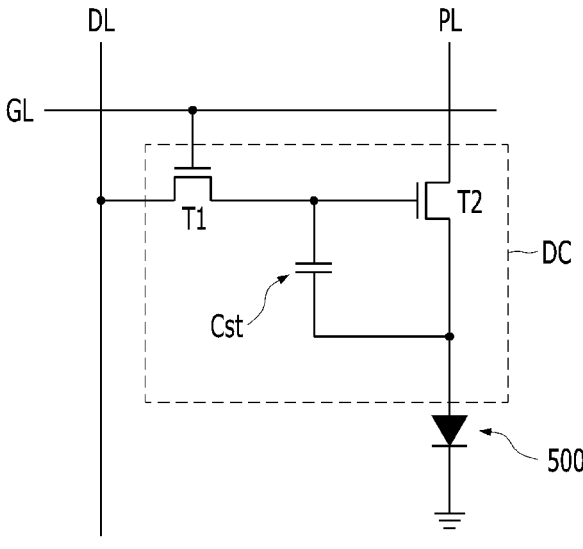
FIG. 2 is a view showing a circuit of a unit pixel area in the display apparatus according to the first embodiment of the present disclosure.

FIG. 1 is a view schematically showing a display apparatus according to a first embodiment of the present disclosure. FIG. 2 is a view showing a circuit of a unit pixel area in the display apparatus according to the first embodiment of the present disclosure.

Referring to FIGS. 1 and 2, the display apparatus according to the first embodiment of the present disclosure may include a display panel DP and driving units GD, DD, TC and PU. The display panel DP may generate an image provided to a user. For example, the display panel DP may include a plurality of pixel areas PA. The driving units GD, DD, TC and PU may provide various signals to realize the image to each pixel PA of the display panel DP through signal wirings GL, DL and PL. For example, the driving units GD, DD, TC and PU may include a gate driver GD, a data driver DD, a power unit PU and a timing controller TC.

The signal wirings GL, DL and PL may include gate lines GL electrically connected to the gate driver GD, data lines DL electrically connected to the data driver DD, and power voltage supply lines PL electrically connected to the power unit PU. For example, the gate driver GD may sequentially apply a gate signal to each pixel area PA of the display panel DP through the gate lines GL, the data driver DD may apply a data signal to each pixel area PA of the display panel DP through the data lines DL, and the power unit PU may supply a power voltage to each pixel area PA of the display panel DP through the power voltage supply lines PL. The timing controller TC may control the operations of gate driver GD and the data driver DD. For example, the gate driver GD may receive clock signals, reset signals and a start signal from the timing controller TC, and the data driver DD may receive digital video data and a source timing signal from the timing controller TC.

Each of the pixel areas PA of the display panel DP may realize a specific color. For example, a light-emitting device 500 and a pixel driving circuit DC electrically connected to the light-emitting device 500 may be disposed in each pixel area PA. The pixel driving circuit DC may be electrically connected to the driving units GD, DD, TC and PU. For example, the pixel driving circuit DC may be electrically connected to one of the gate lines GL, one of the data lines DL and one of the power voltage supply lines PL. The pixel driving circuit DC may supply a driving current corresponding to the data signal to the light-emitting device 500 according to the gate signal. For example, the pixel driving circuit DC may include a first thin film transistor T1, a second thin film transistor T2 and a storage capacitor Cst.

Figure 3:
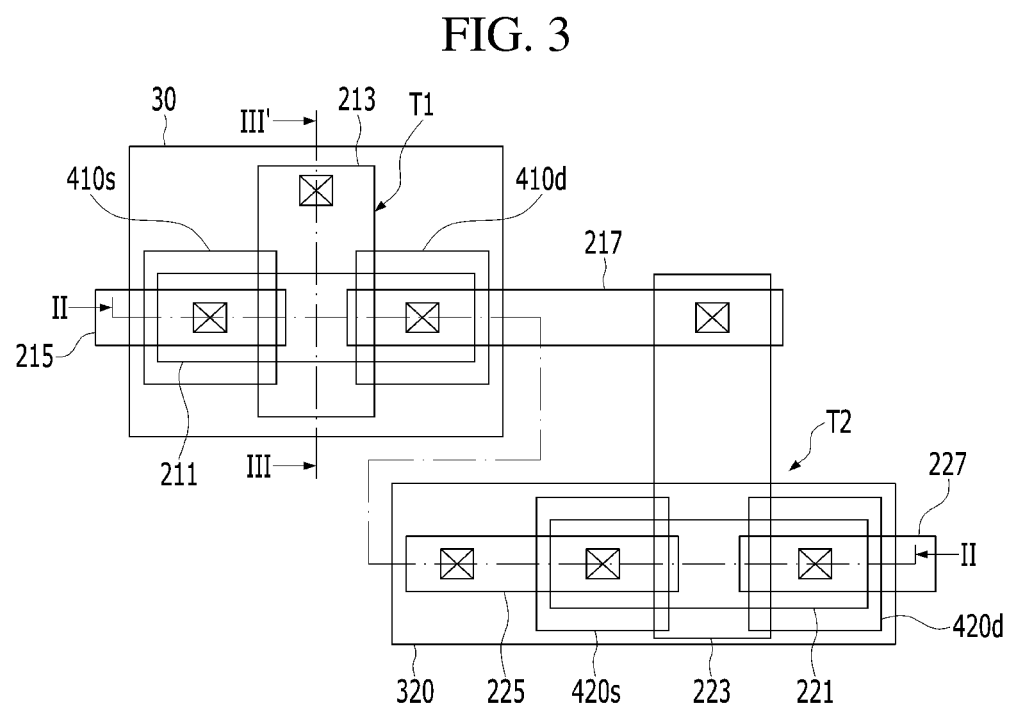
Figure 4:
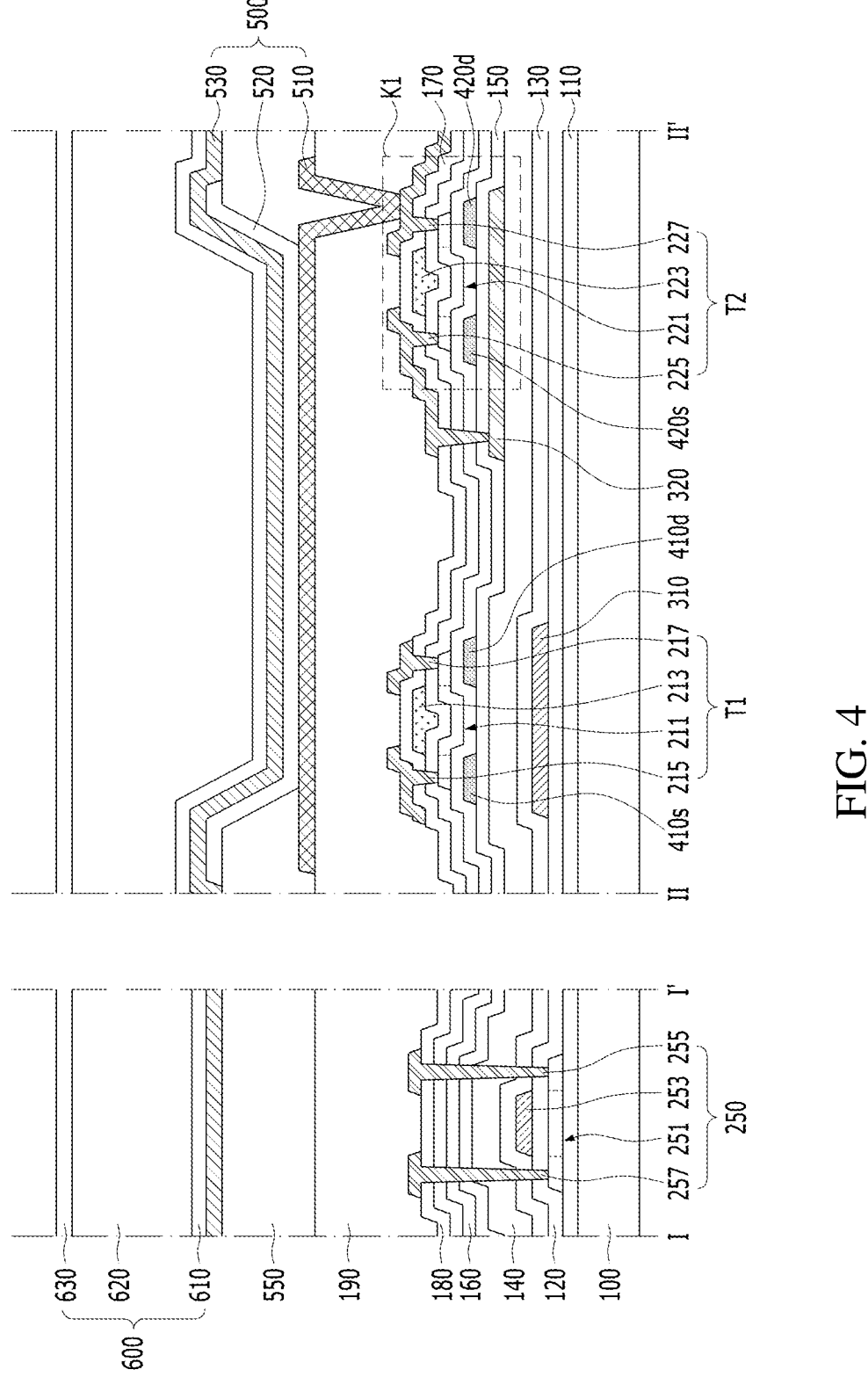
FIG. 4 is a view taken along I-I' of FIG. 1 and II-II' of FIG. 3 according to an embodiment of the present disclosure.
Figure 5:
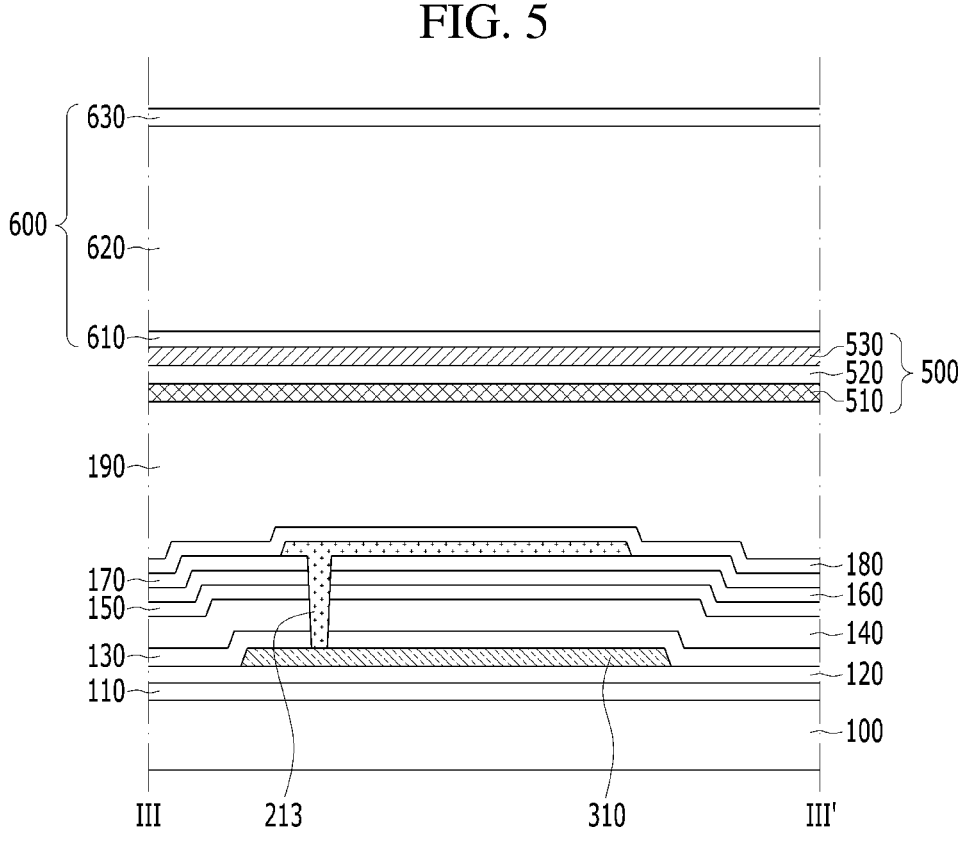
FIG. 5 is a view taken along III-III' of FIG. 3 according to an embodiment of the present disclosure.
Figure 6:
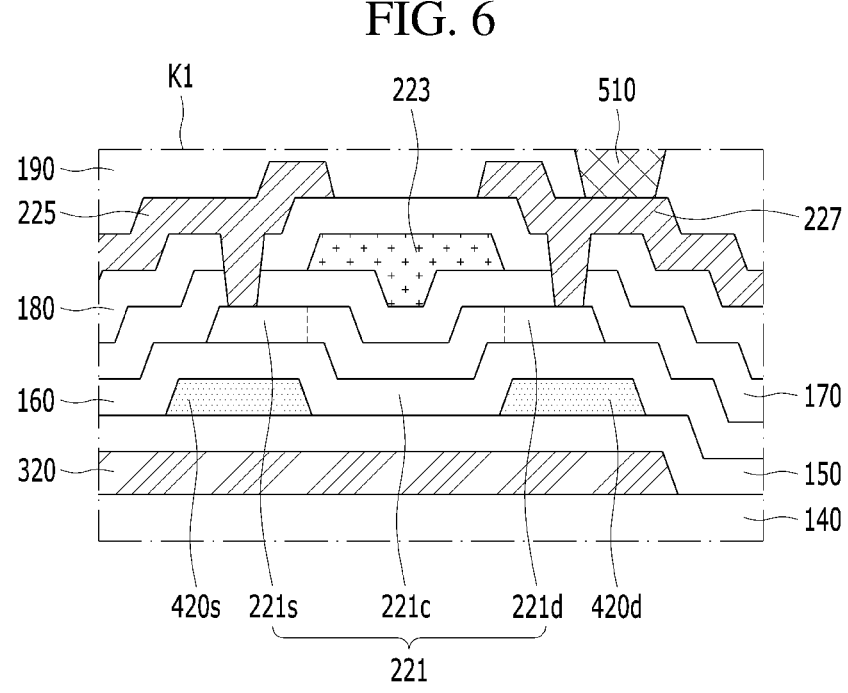
FIG. 6 is an enlarged view of K1 region in FIG. 4.

FIG. 3 is a view schematically showing a plane shape of a first thin film transistor and a second thin film transistor in each pixel area PA of the display apparatus according to the first embodiment of the present disclosure. FIG. 4 is a view taken along I-I' of FIG. 1 and II-II' of FIG. 3. FIG. 5 is a view taken along III-III' of FIG. 3. FIG. 6 is an enlarged view of K1 region in FIG. 4.

Referring to FIGS. 1 to 6, the first thin film transistor T1 and the second thin film transistor T2 of each pixel area PA may be disposed on a device substrate 100. The device substrate 100 may include an insulating material. For example, the device substrate 100 may include glass or plastic.

A lower buffer insulating layer 110 may be disposed on an upper surface of the device substrate 100. The first thin film transistor T1 and the second thin film transistor T2 may be disposed on the lower buffer insulating layer 110. For example, the lower buffer insulating layer 110 may be in direct contact with the upper surface of the device substrate 100. The lower buffer insulating layer 110 may include an insulating material. For example, the lower buffer insulating layer 110 may include an inorganic insulating material, such as silicon oxide (SiO) and silicon nitride (SiN). The lower buffer insulating layer 110 may have a multi-layer structure. For example, the lower buffer insulating layer 110 may have a stacked structure of a layer made of silicon oxide (SiO) and a layer made of silicon nitride (SiN). Thus, in the display apparatus according to the first embodiment of the present disclosure, pollution due to the device substrate 100 in a process of forming the first thin film transistor T1 and the second thin film transistor T2 may be prevented or at least reduced.

The first thin film transistor T1 may include a first active pattern 211, a first gate electrode 213, a first source electrode 215 and a first drain electrode 217. The first thin film transistor T1 may transmit the data signal to the second thin film transistor T2 according to the gate signal. For example, the first gate electrode 213 of the first thin film transistor T1 may be electrically connected to the gate line GL, and the first source electrode 215 of the first thin film transistor T1 may be electrically connected to the date line DL.

The first active pattern 211 may include a semiconductor material. For example, the first active pattern 211 may include an oxide semiconductor, such as IGZO. The first active pattern 211 may include a first source region, a first channel region and a first drain region. The first channel region may be disposed between the first source region and the first drain region. The first source region and the first drain region may have a material composition ratio as the first channel region. For example, the first source region, the first channel region and the first drain region may not include an impurity. Thus, in the display apparatus according to the first embodiment of the present disclosure, a decrease in a width of the first channel region due to the diffusion of the impurities may be prevented or at least reduced. Therefore, in the display apparatus according to the first embodiment of the present disclosure, a change in electric characteristics of the first thin film transistor T1 due to a subsequent process may be prevented or at least reduced.

The first gate electrode 213 may include a conductive material. For example, the first gate electrode 213 may include a metal, such as aluminum (Al), chrome (Cr), copper (Cu), molybdenum (Mo), titanium (Ti) and tungsten (W). The first gate electrode 213 may be disposed on the first active pattern 211. For example, the first active pattern 211 may be disposed between the device substrate 100 and the first gate electrode 213. The first gate electrode 213 may overlap the first channel region of the first active pattern 211. The first gate electrode 213 may be spaced apart from the first active pattern 211. For example, an upper gate insulating layer 170 covering the first active pattern 211 may be disposed on the lower buffer insulating layer 110, and the first gate electrode 213 may be disposed on the upper gate insulating layer 170.

The upper gate insulating layer 170 may include an insulating material. For example, the upper gate insulating layer 170 may include an inorganic insulating material, such as silicon oxide (SiO). The first gate electrode 213 may be insulated from the first active pattern 211 by the upper gate insulating layer 170. The first channel region of the first active pattern 211 may have an electric conductivity corresponding to a voltage applied to the first gate electrode 213.

The first source electrode 215 may include a conductive material. For example, the first source electrode 215 may include a metal, such as aluminum (Al), chrome (Cr), copper (Cu), molybdenum (Mo), titanium (Ti) and tungsten (W). The first source electrode 215 may include a material different from the first gate electrode 213. The first source electrode 215 may be disposed on a layer different from the first gate electrode 213. For example, an upper interlayer insulating layer 180 covering the first gate electrode 213 may be disposed on the upper gate insulating layer 170, and the first source electrode 215 may be disposed on the upper interlayer insulating layer 180.

The upper interlayer insulating layer 180 may include an insulating material. For example, the upper interlayer insulating layer 180 may include an inorganic insulating material, such as silicon oxide (SiO) and silicon nitride (SiN). The first source electrode 215 may be electrically connected to the first source region of the first active pattern 211. For example, the upper gate insulating layer 170 and the upper interlayer insulating layer 180 may each include a first source contact hole partially exposing the first source region of the first active pattern 211. The first source electrode 215 may be in direct contact with the first source region of the first active pattern 211 through the first source contact hole.

The first drain electrode 217 may include a conductive material. For example, the first drain electrode 217 may include a metal, such as aluminum (Al), chrome (Cr), copper (Cu), molybdenum (Mo), titanium (Ti) and tungsten (W). The first drain electrode 217 may include a material different from the first gate electrode 213. The first drain electrode 217 may be disposed on a layer different from the first gate electrode 213. For example, the first drain electrode 217 may be disposed on the upper interlayer insulating layer 180. The first drain electrode 217 may be disposed on a same layer as the first source electrode 215. The first drain electrode 217 may include a same material as the first source electrode 215. For example, the first drain electrode 217 may be formed simultaneously with the first source electrode 215.

The first drain electrode 217 may be electrically connected to the first drain region of the first active pattern 211. For example, the upper gate insulating layer 170 and the upper interlayer insulating layer 180 may each include a first drain contact hole partially exposing the first drain region of the first active pattern 211. The first drain electrode 217 may be in direct contact with the first drain region of the first active pattern 211 through the first drain contact hole.

A first light-blocking pattern 310 may be disposed between the lower buffer insulating layer 110 and the first thin film transistor T1. The first light-blocking pattern 310 may block external light traveling in a direction of the first active pattern 211 passing through the device substrate 100. For example, the first light-blocking pattern 310 may overlap the first active pattern 211. The first light-blocking pattern 310 may include a conductive material. For example, the first light-blocking pattern 310 may include a metal, such as aluminum (Al), chrome (Cr), copper (Cu), molybdenum (Mo), titanium (Ti) and tungsten (W).

The first light-blocking pattern 310 may be spaced apart from the first active pattern 211. For example, an upper buffer insulating layer 150 may be disposed between the first light-blocking pattern 310 and the first active pattern 211. The upper buffer insulating layer 150 may include an insulating material. For example, the upper buffer insulating layer 150 may include an inorganic insulating material, such as silicon oxide (SiO) and silicon nitride (SiN). The first light-blocking pattern 310 may be insulated from the first active pattern 211 by the upper buffer insulating layer 150. The upper buffer insulating layer 150 may extend beyond the first light-blocking pattern 310.

The first light-blocking pattern 310 may be electrically connected to the first gate electrode 213. For example, a first light-blocking contact hole penetrating the lower buffer insulating layer 130, the upper buffer insulating layer 150, and the upper gate insulating layer 170 may expose a portion of the first light-blocking pattern 310 at the outside of the first active pattern 211, and the first gate electrode 213 may be in direct contact with the first light-blocking pattern 310 through the first light-blocking contact hole. The first light-blocking pattern 310 may overlap the first gate electrode 213. For example, the first light-blocking pattern 310 may function as a lower gate of the first thin film transistor T1.

A first source semiconductor pattern 410s may be disposed between the first source region of the first active pattern 211 and the first light-blocking pattern 310, and a first drain semiconductor pattern 410d may be disposed between the first drain region of the first active pattern 211 and the first light-blocking pattern 310. For example, the first source semiconductor pattern 410s may overlap the first source region of the first active pattern 211, and the first drain semiconductor pattern 410d may overlap the first drain region of the first active pattern 211. The first drain semiconductor pattern 410d may be spaced apart from the first source semiconductor pattern 410s. For example, the first channel region of the first active pattern 211 may be disposed between the first source semiconductor pattern 410s and the first drain semiconductor pattern 410d. The first source semiconductor pattern 410s and the first drain semiconductor pattern 410d may be disposed outside the first channel region.

The first source semiconductor pattern 410s and the first drain semiconductor pattern 410d may include a semiconductor material and n-type impurities. For example, the first source semiconductor pattern 410s and the first drain semiconductor pattern 410d may be formed by a process of doping amorphous silicon or polycrystalline silicon with n-type impurities, such as phosphorus (P) and arsenic (AS). The first drain semiconductor pattern 410d may include same impurities as the first source semiconductor pattern 410s. For example, the first drain semiconductor pattern 410d may be formed simultaneously with the first source semiconductor pattern 410s.

A fermi level of the first source region and the first drain region may be increased by the first source semiconductor pattern 410s and the first drain semiconductor pattern 410d which include n-type impurities. That is, in the display apparatus according to the first embodiment of the present disclosure, an amount of electrons stored in the first source region and the first drain region of the first active pattern 211 may be increased by the first source semiconductor pattern 410s and the first drain semiconductor pattern 410d. Thus, in the display apparatus according to the first embodiment of the present disclosure, a resistance of the first source region and a resistance of the first drain region may become to be lower than a resistance of the first channel region.

Table 1 shows the resistance of an oxide semiconductor A which is un-doped, an oxide semiconductor B doped with n-type impurities, and oxide semiconductors C, D and E on semiconductor patterns doped with n-type impurities at specific concentrations.

TABLE 1

| | A | B | C | D | E |
|---|---|---|---|---|---|
| Concentration of semiconductor(cm$^{-3}$) | X | X | $10^{19}$ | $10^{20}$ | $10^{21}$ |
| Resistance(Ω) | 1890 | 734 | 915 | 891 | 871 |

Referring Table 1, the oxide semiconductors C, D and E on the semiconductor patterns doped with n-type impurities may have a resistance significantly lower than the oxide semiconductor A, which is un-doped. And, regardless of the doping concentration of the semiconductor pattern, the resistance of the oxide semiconductors C, D and E on the semiconductor pattern may not be significantly different from a resistance of the oxide semiconductor B doped with n-type impurities. That is, in the display apparatus according to the first embodiment of the present disclosure, a resistance of the first source region on the first source semiconductor pattern 410s and a resistance of the first drain region on the first drain semiconductor pattern 410d may be significantly lower than a resistance of the first channel region. Therefore, in the display apparatus according to the first embodiment of the present disclosure, the first source region and the first drain region having a resistance significantly lower than the first channel region may be formed in the first active pattern 211, without a process of doping with impurities.

The first source semiconductor pattern 410s and the first drain semiconductor pattern 410d may be spaced apart from the first active pattern 211. For example, an intermediate insulating layer 160 may be disposed between the first source semiconductor pattern 410s and the first active pattern 211 and between the first drain semiconductor pattern 410d and the first active pattern 211. The intermediate insulating layer 160 may include an insulating material. For example, the intermediate insulating layer 160 may include an inorganic insulating material, such as silicon oxide (SiO) and silicon nitride (SiN). The first source semiconductor pattern 410s and the first drain semiconductor pattern 410d may be insulated from the first active pattern 211 by the intermediate insulating layer 160. Thus, in the display apparatus according to the first embodiment of the present disclosure, the impurities of the first source semiconductor pattern 410s and/or the impurities of the first drain semiconductor pattern 410d may not diffuse into the first active pattern 211. Therefore, in the display apparatus according to the first embodiment of the present disclosure, a change in the electric characteristics of the first thin film transistor T1 due to the diffusion of the impurities may be prevented or at least reduced.

The intermediate insulating layer 160 may extend beyond the first source semiconductor pattern 410s and the first drain semiconductor pattern 410d. The intermediate insulating layer 160 may be in direct contact with the upper gate insulating layer 170 at the outside of the first active pattern 211. For example, the first active pattern 211 may be surrounded by the intermediate insulating layer 160 and the upper gate insulating layer 170. That is, in the display apparatus according to the first embodiment of the present disclosure, a process of etching the upper gate insulating layer 170 to conduct the first source region and the first drain region of the first active pattern 211 may be not performed. Thus, in the display apparatus according to the first embodiment of the present disclosure, a physical damage of the first active pattern 211 may be prevented or at least reduced.

The second thin film transistor T2 may have a same structure as the first thin film transistor T1. For example, the second thin film transistor T2 may include a second active pattern 221, a second gate electrode 223, a second source electrode 225 and a second drain electrode 227. The second thin film transistor T2 may generate the driving current corresponding to the data signal. For example, the second gate electrode 223 of the second thin film transistor T2 may be electrically connected to the first drain electrode 217 of the first thin film transistor T1, and the second source electrode 225 of the second thin film transistor T2 may be electrically connected to the power voltage supply line PL. The driving current generated by the second thin film transistor T2 may be supplied to the light-emitting device 500. For example, the second thin film transistor T2 may function as a driving thin film transistor. The light-emitting device 500 may be electrically connected to the second drain electrode 227 of the second thin film transistor T2.

The second active pattern 221 may include a semiconductor material. For example, the second active pattern 221 may include an oxide semiconductor, such as IGZO. The second active pattern 221 may include a same material as the first active pattern 211. The second active pattern 221 may be disposed on a same layer as the first active pattern 211. For example, the second active pattern 221 may be disposed between the intermediate insulating layer 160 and the upper gate insulating layer 170.

The second active pattern 221 may include a second source region 221s, a second channel region 221c and a second drain region 221d. The second channel region 221c may be disposed between the second source region 221s and the second drain region 221d. The second source region 221s and the second drain region 221d may have a material composition ratio same as the second channel region 221c. For example, the second source region 221s, the second channel region 221c, and the second drain region 221d may not include impurities. Thus, in the display apparatus according to the first embodiment of the present disclosure, a decrease in a width of the second channel region 221c due to the diffusion of the impurities may be prevented or at least reduced. Therefore, in the display apparatus according to the first embodiment of the present disclosure, a change in electrical characteristics of the second thin film transistor T2 due to a subsequent process may be prevented or at least reduced.

The second gate electrode 223 may include a conductive material. For example, the second gate electrode 223 may include a metal, such as aluminum (Al), chrome (Cr), copper (Cu), molybdenum (Mo), titanium (Ti) and tungsten (W). The second gate electrode 223 may be disposed on the second active pattern 221. For example, the second gate electrode 223 may overlap the second channel region 221c of the second active pattern 221. The second gate electrode 223 may be spaced apart from the second active pattern 221. The second gate electrode 223 may be insulated from the second active pattern 221. The second gate electrode 223 may be disposed on a same layer as the first gate electrode 213. For example, the second gate electrode 223 may be disposed between the upper gate insulating layer 170 and the upper interlayer insulating layer 180. The second gate electrode 223 may include a same material as the first gate electrode 213. The second channel region 221c of the second active pattern 221 may have an electrical conductivity corresponding to a voltage applied to the second gate electrode 223.

The second source electrode 225 may include a conductive material. For example, the second source electrode 225 may include a metal, such as aluminum (Al), chrome (Cr), copper (Cu), molybdenum (Mo), titanium (Ti) and tungsten (W). The second source electrode 225 may include a same material as the first source electrode 215. The second source electrode 225 may be disposed on a same layer as the first source electrode 215. For example, the second source electrode 225 may be disposed on the upper interlayer insulating layer 180. The second source electrode 225 may be formed simultaneously with the first source electrode 215.

The second source electrode 225 may be electrically connected to the second source region 221s of the second active pattern 221. For example, the upper gate insulating layer 170 and the upper interlayer insulating layer 180 may include a second source contact hole partially exposing the second source region 221s of the second active pattern 221. The second source electrode 225 may be in direct contact with the second source region 221s of the second active pattern 221 through the second source contact hole.

The second drain electrode 227 may include a conductive material. For example, the second drain electrode 227 may include a metal, such as aluminum (Al), chrome (Cr), copper (Cu), molybdenum (Mo), titanium (Ti) and tungsten (W). The second drain electrode 227 may include a same material as the first drain electrode 217. The second drain electrode 227 may be disposed on a same layer as the first drain electrode 217. For example, the second drain electrode 227 may be disposed on the upper interlayer insulating layer 180. The second drain electrode 227 may be formed simultaneously with the first drain electrode 217. For example, the second drain electrode 227 may be formed simultaneously with the second source electrode 225. The second drain electrode 227 may include a same material as the second source electrode 225.

The second drain electrode 227 may be electrically connected to the second drain region 221d of the second active pattern 221. For example, the upper gate insulating layer 170 and the upper interlayer insulating layer 180 may include a second drain contact hole partially exposing the second drain region 221d of the second active pattern 221. The second drain electrode 227 may be in direct contact with the second drain region 221d of the second active pattern 221 through the second drain contact hole.

A second light-blocking pattern 320 may be disposed between the lower buffer insulating layer 110 and the upper buffer insulating layer 150. The second light-blocking pattern 320 may block the external light traveling in a direction of the second active pattern 221 passing through the device substrate 100. For example, the second light-blocking pattern 320 may overlap the second active pattern 221. The second light-blocking pattern 320 may include a conductive material. For example, the second light-blocking pattern 320 may include a metal, such as aluminum (Al), chrome (Cr), copper (Cu), molybdenum (Mo), titanium (Ti) and tungsten (W). The second light-blocking pattern 320 may be insulated from the second active pattern 221 by the upper buffer insulating layer 150.

A specific voltage may be applied to the second light-blocking pattern 320. The voltage applied to the second light-blocking pattern 320 may be different from the voltage applied to the second gate electrode 223. For example, the second light-blocking pattern 320 may be electrically connected to the second source electrode 225. A second light-blocking contact hole penetrating the upper buffer insulating layer 150, the intermediate insulating layer 160, the upper gate insulating layer 170, and the upper interlayer insulating layer 180 may expose a portion of the second light-blocking pattern 320 outside the second active pattern 221, and the second source electrode 225 may be in direct contact with the second light-blocking pattern 320 through the second light-blocking contact hole.

The second light-blocking pattern 320 may include a material different from the first light-blocking pattern 310. The second light-blocking pattern 320 may be disposed on a layer different from the first light-blocking pattern 310. For example, a separating insulating layer 140 covering the first light-blocking pattern 310 may be disposed between the lower buffer insulating layer 110 and the second light-blocking pattern 320. The separating insulating layer 140 may include an insulating material. For example, the separating insulating layer 140 may include an inorganic insulating material, such as silicon oxide (SiO) and silicon nitride (SiN).

A straight distance between the second light-blocking pattern 320 and the second active pattern 221 may be smaller than a straight distance between the first light-blocking pattern 310 and the first active pattern 211. In the thin film transistors T1 and T2 on each light-blocking pattern 310 and 320, the amount of change in the effective gate voltage may be determined by the following equation. Herein, $\Delta$Veff denotes the amount of change in the effective gate voltage, $\Delta$VGAT denotes a change amount of a voltage applied to the gate electrodes 213 and 223, C1 denotes a capacitance of the parasitic capacitor formed between the light-blocking patterns 310 and 320 and the active patterns 211 and 221, C2 denotes a capacitance of a parasitic capacitor formed between the active patterns 211 and 221 and the gate electrodes 213 and 223, and CACT denotes a capacitance of a parasitic capacitor formed by a voltage applied to the source region 221s and the drain region 221d of the active patterns 211 and 221.

$$\Delta V_{eff} = \frac{C2}{C2 + C_{ACT} + C1} \times \Delta V_{GAT}$$

Since a capacitance of a capacitor is inversely proportional to a distance between the conductors constituting the capacitor, a capacitance of a parasitic capacitor formed between the second light-blocking pattern 320 and the second active pattern 221 of the second thin film transistor T2 may be greater than a capacitance of a parasitic capacitor formed between the first light-blocking pattern 310 and the first active pattern 211 of the first thin film transistor T1. Thus, in the display apparatus according to the first embodiment of the present disclosure, an effective gate voltage of the second thin film transistor T2 may be smaller than an effective gate voltage of the first thin film transistor T1. Generally, when an effective gate voltage of the thin film transistors T1, T2 and 250 is reduced, S-factor, which means the inverse ratio of the current change according to the change in voltage applied to the gate electrodes 213 and 223 of the corresponding thin film transistors T1 and T2, increases. That is, in the display apparatus according to the first embodiment of the present disclosure, the rate of change in the current according to the voltage applied to the second gate electrode 223 of the second thin film transistor T2, which functions as a driving thin film transistor, may decrease. Therefore, in the display device according to the first embodiment of the present disclosure, the occurrence of spots in the low grayscale may be prevented or at least reduced.

A second source semiconductor pattern 420s may be disposed between the second source region 221s of the second active pattern 221 and the second light-blocking pattern 320, and a second drain semiconductor pattern 420d may be disposed between the second drain region 221d of the second active pattern 221 and the second light-blocking pattern 320. The second source semiconductor pattern 420s and the second drain semiconductor pattern 420d may each include a semiconductor and n-type impurities. The second source semiconductor pattern 420s and the second drain semiconductor pattern 420d may be disposed on a same layer as the first source semiconductor pattern 410s and the first drain semiconductor pattern 410d. For example, the second source semiconductor pattern 420s and the second drain semiconductor pattern 420d may be disposed between the upper buffer insulating layer 150 and the intermediate insulating layer 160. The second source semiconductor pattern 420s and the second drain semiconductor pattern 420d may include a same semiconductor and same impurities as the first source semiconductor pattern 410s and the first drain semiconductor pattern 410d. For example, the second source semiconductor pattern 420s and the second drain semiconductor pattern 420d may be formed simultaneously with the first source semiconductor pattern 410s and the first drain semiconductor pattern 410d.

The second drain semiconductor pattern 420d overlapping with the second drain region 221d of the second active pattern 221 may be spaced apart from the second source semiconductor pattern 420s overlapping with the second source region 221s of the second active pattern 221. For example, the second channel region 221c of the second active pattern 221 may be disposed between the second source semiconductor pattern 420s and the second drain semiconductor pattern 420d. The second source semiconductor pattern 420s and the second drain semiconductor pattern 420d may be disposed outside the second channel region 221c.

A fermi level of the second source region 221s and the second drain region 221d may be increased by the second source semiconductor pattern 420s and the second drain semiconductor pattern 420d which include n-type impurities. That is, in the display apparatus according to the first embodiment of the present disclosure, an amount of electrons stored in the second source region 221s and the second drain region 221d of the second active pattern 221 may be increased by the second source semiconductor pattern 420s and the second drain semiconductor pattern 420d. Thus, in the display apparatus according to the first embodiment of the present disclosure, a resistance of the second source region 221s and a resistance of the second drain region 221d may become to be significantly lower than a resistance of the second channel region 221c. Therefore, in the display apparatus according to the first embodiment of the present disclosure, the second source region 221s and the second drain region 221d having a resistance significantly lower than the second channel region 221c may be formed in the second active pattern 221, without a process of doping with impurities.

The second source semiconductor pattern 420s and the second drain semiconductor pattern 420d may be spaced apart from the second active pattern 221 by the intermediate insulating layer 160. Thus, in the display apparatus according to the first embodiment of the present disclosure, the impurities of the second source semiconductor pattern 420s and/or the impurities of the second drain semiconductor pattern 420d may not diffuse into the second active pattern 221. Therefore, in the display apparatus according to the first embodiment of the present disclosure, a change in the electric characteristics of the second thin film transistor T2 due to the diffusion of the impurities may be prevented or at least reduced.

The second active pattern 221 may be surrounded by the intermediate insulating layer 160 and the upper gate insulating layer 170. That is, in the display apparatus according to the first embodiment of the present disclosure, a process of etching the upper gate insulating layer 170 to conduct the second source region 221s and the second drain region 221d of the second active pattern 221 may not be performed. Thus, in the display apparatus according to the first embodiment of the present disclosure, a physical damage of the second active pattern 221 may be prevented or at least reduced.

The storage capacitor Cst may maintain a signal applied to the second gate electrode 223 of the second thin film transistor T2 for one frame. For example, the storage capacitor Cst may be electrically connected between the second gate electrode 223 and the second drain electrode 227 of the second thin film transistor T2. The storage capacitor Cst may be formed using a process of forming the first light-blocking pattern 310, the second light-blocking pattern 320, the first thin film transistor T1 and the second thin film transistor T2.

A planarization layer 190 may be disposed on the first thin film transistor T1 and the second thin film transistor T2. The planarization layer 190 may remove a thickness difference due to the driving circuit DC. For example, an upper surface of the planarization layer 190 opposite to the device substrate 100 may be flat. The planarization layer 190 may extend beyond the first source electrode 215, the first drain electrode 217, the second source electrode 225 and the second drain electrode 227. For example, the planarization layer 190 may be in direct contact with the upper interlayer insulating layer 180 at the outside of the first thin film transistor T1 and the second thin film transistor T2. The planarization layer 190 may include an insulating material. For example, the planarization layer 190 may include an organic insulating material.

The light-emitting device 500 may be disposed on the planarization layer 190. The light-emitting device 500 may emit light displaying a specific color. For example, the light-emitting device 500 may include a first electrode 510, a light-emitting layer 520 and a second electrode 530, which are sequentially stacked on the upper surface of the planarization layer 190.

The first electrode 510 may include a conductive material. The first electrode 510 may include a material having a high reflectance. For example, the first electrode 510 may include a metal, such as aluminum (Al) and silver (Ag). The first electrode 510 may have a multi-layer structure. For example, the first electrode 510 may have a structure in which a reflective electrode made of a metal is disposed between transparent electrodes made of a transparent conductive material, such as ITO and IZO.

The first electrode 510 may be electrically connected to the pixel driving circuit DC. For example, the planarization layer 190 may include an electrode contact hole partially exposing the second drain electrode 227 of the second thin film transistor T2. The first electrode 510 may be in direct contact with the second drain electrode 227 through the electrode contact hole.

The light-emitting layer 520 may generate light having luminance corresponding to a voltage difference between the first electrode 510 and the second electrode 530. For example, the light-emitting layer 520 may include an emission material layer (EML) having an emission material. The emission material may include an organic material, an inorganic material or a hybrid material. For example, the display apparatus according to the first embodiment of the present disclosure may be an organic light-emitting display apparatus including an organic emission material.

The light-emitting layer 520 may have a multi-layer structure. For example, the light-emitting layer 520 may further include at least one of a hole injection layer (HIL), a hole transport layer (HTL), an electron transport layer (ETL) and an electron injection layer (EIL). Thus, in the display apparatus according to the first embodiment of the present disclosure, the emission efficiency of each light-emitting layer 520 may be improved.

The second electrode 530 may include a conductive material. The second electrode 530 may include a material different from the first electrode 510. A transmittance of the second electrode 530 may be higher than a transmittance of the first electrode 510. For example, the second electrode 530 may be a transparent electrode made of a transparent conductive material, such as ITO and IZO. Thus, in the display apparatus according to the first embodiment of the present disclosure, the light generated by the light-emitting layer 520 may be emitted outside through the second electrode 530.

A bank insulating layer 550 may be disposed on the planarization layer 190. The bank insulating layer 550 may include an insulating material. For example, the bank insulating layer 550 may include an organic insulating material. The bank insulating layer 550 may include a material different from the planarization layer 190. The bank insulating layer 550 may define an emission area. For example, the bank insulating layer 550 may cover an edge of the first electrode 510. The light-emitting layer 520 and the second electrode 530 may be stacked on a portion of the first electrode 510 exposed by the bank insulating layer 550.

The electrode contact hole to connect the first electrode 510 to the second drain electrode 227 may overlap the bank insulating layer 550. For example, the electrode contact hole may be disposed outside the emission area defined by the bank insulating layer 550. Thus, in the display apparatus according to the first embodiment of the present disclosure, luminance deviation according to a generation position of the light emitted from the light-emitting device 500 may be prevented or at least reduced. Therefore, in the display apparatus according to the first embodiment of the present disclosure, generation of Mura may be prevented or at least reduced.

The light emitted from the light-emitting device 500 of each pixel area PA may display a color different from the light emitted from the light-emitting device 500 of adjacent pixel area PA. For example, the light-emitting layer 520 of each pixel area PA may be spaced apart from the light-emitting layer 520 of adjacent pixel area PA. The light-emitting layer 520 of each pixel area PA may include an end on the bank insulating layer 550.

A voltage applied to the second electrode 530 of each pixel area PA may be same as a voltage applied to the second electrode 530 of adjacent pixel area PA. For example, the second electrode 530 of each pixel area PA may be electrically connected to the second electrode 530 of adjacent pixel area PA. The second electrode 530 of each pixel area PA may include a same material as the second electrode 530 of adjacent pixel area PA. For example, the second electrode 530 of each pixel area PA may be formed simultaneously with the second electrode 530 of adjacent pixel area PA. The second electrode 530 of each pixel area PA may be in direct contact with the second electrode 530 of adjacent pixel area PA. Thus, in the display apparatus according to the first embodiment of the present disclosure, a process of forming the second electrode 530 in each pixel area PA may be simplified.

An encapsulation element 600 may be disposed on the light-emitting device 500 of each pixel area PA. The encapsulation element 600 may prevent or at least reduce damage of each light-emitting device 500 due to the external impact and moisture. The encapsulation element 600 may include an insulating material. The encapsulation element 600 may have a multi-layer structure. For example, the encapsulation element 600 may include a first encapsulating layer 610, a second encapsulating layer 620 and a third encapsulating layer 630, which are sequentially stacked. The second encapsulating layer 620 may include a material different from the first encapsulating layer 610 and the third encapsulating layer 630. For example, the first encapsulating layer 610 and the third encapsulating layer 630 may be an inorganic insulating layer made of an inorganic insulating material, and the second encapsulating layer 620 may be an organic insulating layer made of an organic insulating material. Thus, in the display apparatus according to the first embodiment of the present disclosure, the damage of the light-emitting devices 500 due to the external impact and moisture may be effectively prevented or at least reduced. A thickness difference due to the light-emitting devices 500 may be removed by the second encapsulating layer 620. For example, an upper surface of the encapsulation element 600 opposite to the device substrate 100 may be a flat surface.

Accordingly, the display apparatus according to the first embodiment of the present disclosure may include the thin film transistors T1 and T2, the source semiconductor patterns 410s and 420s, and the drain semiconductor patterns 410d and 420d in each pixel area PA, wherein the thin film transistors T1 and T2 may include the active patterns 211 and 221 made of an oxide semiconductor, respectively, wherein the active patterns 211 and 221 may include the source region 221s overlapping with the source semiconductor pattern 410s and 420s, the drain region 221d overlapping with the drain semiconductor pattern 410d and 420d, and the channel region 221c between the source region 221s and the drain region 221d, and wherein the source semiconductor patterns 410s and 420s and the drain semiconductor patterns 410d and 420d may include n-type impurities. Thus, in the display apparatus according to the first embodiment of the present disclosure, a resistance of the source region 221s and a resistance of the drain region 221d may be lower than a resistance of the channel region 221c, without a process of etching the upper gate insulating layer 170 disposed on the active patterns 211 and 221 or a process of doping with impurities. Therefore, in the display apparatus according to the first embodiment of the present disclosure, the physical damage of the active patterns 211 and 221 and a change in electrical characteristics of the thin film transistors T1 and T2 may be prevented or at least reduced, and the quality of the image may be improved.

At least one of the driving units GD, DD, PU and TC may be mounted on the display panel DP. For example, the display panel DP may include a display area AA in which the pixel areas PA are disposed, and a bezel area BZ disposed outside the display area AA, and the gate driver GD may be formed in the bezel area BZ of the display panel DP. The lower buffer insulating layer 110, the separating insulating layer 140, the upper buffer insulating layer 150, the intermediate insulating layer 160, the upper gate insulating layer 170, the upper interlayer insulating layer 180, the planarization layer 190, the bank insulating layer 550, the second electrode 530 and the encapsulating element 600 may extend onto the bezel area BZ. For example, the gate driver GD may include a bezel thin film transistor 250 between the lower buffer insulating layer 110 and the planarization layer 190 of the bezel area BZ.

The bezel thin film transistor 250 may have a same structure as the first thin film transistor T1 and the second thin film transistor T2 of each pixel area PA. For example, the bezel thin film transistor 250 may include a bezel active pattern 251, a bezel gate electrode 253, a bezel source electrode 255 and a bezel drain electrode 257.

The bezel active pattern 251 may include a semiconductor. The bezel active pattern 251 may include a material different from the first active pattern 211 and the second active pattern 221. For example, the bezel active pattern 251 may include a Low-Temperature Poly-Si (LTPS). The bezel active pattern 251 may be disposed on a layer different from the first active pattern 211 and the second active pattern 221. For example, the bezel active pattern 251 may be disposed between the lower buffer insulating layer 110 and the separating insulating layer 140. Thus, in the display apparatus according to the first embodiment of the present disclosure, damage of the first active pattern 211 and damage of the second active pattern 221 due to a process of forming the bezel active pattern 251 may be prevented or at least reduced.

The bezel active pattern 251 may include a bezel source region, a bezel channel region and a bezel drain region. The bezel channel region may be disposed between the bezel source region and the bezel drain region. The bezel source region and the bezel drain region may have a resistance lower than the bezel channel region. For example, the bezel source region and the bezel drain region may include conductive impurities. That is, in the display apparatus according to the first embodiment of the present disclosure, the bezel source region and the bezel drain region of the bezel thin film transistor 250 requiring a fast response speed may be formed by a process of doping with impurities. Thus, in the display apparatus according to the first embodiment of the present disclosure, the thin film transistors T1 and T2 in each pixel area PA and the bezel thin film transistor 250 in the bezel area BZ may be formed according to characteristics. Therefore, in the display apparatus according to the first embodiment of the present disclosure, the electrical characteristics of the driving units GD, DD, PU, and TC may be maintained, and the quality of an image by the light emitted from each pixel area PA may be improved.

The bezel gate electrode 253 may include a conductive material. For example, the bezel gate electrode 253 may include a metal, such as aluminum (Al), chrome (Cr), copper (Cu), molybdenum (Mo), titanium (Ti) and tungsten (W). The bezel gate electrode 253 may include a material different from the first gate electrode 213 and the second gate electrode 223. The bezel gate electrode 253 may be disposed on a layer different from the first gate electrode 213 and the second gate electrode 223. For example, a lower gate insulating layer 120 and a lower interlayer insulating layer 130 may be stacked between the lower buffer insulating layer 110 and the separating insulating layer 140, the bezel active pattern 251 may be disposed between the lower buffer insulating layer 110 and the lower gate insulating layer 120, and the bezel gate electrode 253 may be disposed between the lower gate insulating layer 120 and the lower interlayer insulating layer 130.

The bezel gate electrode 253 may overlap the bezel channel region of the bezel active pattern 251. The bezel gate electrode 253 may be insulated from the bezel active pattern 251 by the lower gate insulating layer 120. The bezel active pattern 251 may have an electric conductivity corresponding to a voltage applied to the bezel gate electrode 253.

The first light-blocking pattern 310 may be disposed on a same layer as the bezel gate electrode 253. For example, the first light-blocking pattern 310 may be disposed between the lower gate insulating layer 120 and the lower interlayer insulating layer 130. The bezel gate electrode 253 may include a same material as the first light-blocking pattern 310. The bezel gate electrode 253 may be formed simultaneously with the first light-blocking pattern 310.

The bezel source electrode 255 may include a conductive material. For example, the bezel source electrode 225 may include a metal, such as aluminum (Al), chrome (Cr), copper (Cu), molybdenum (Mo), titanium (Ti) and tungsten (W). The bezel source electrode 255 may include a same material as the first source electrode 215 and the second source electrode 225. The bezel source electrode 255 may be disposed on a same layer as the first source electrode 215 and the second source electrode 225. For example, the bezel source electrode 255 may be disposed between the upper interlayer insulating layer 180 and the planarization layer 190. The bezel source electrode 255 may be formed simultaneously with the first source electrode 215 and the second source electrode 225.

The bezel source electrode 255 may be electrically connected to the bezel source region of the bezel active pattern 251. For example, the lower gate insulating layer 120, the lower interlayer insulating layer 130, the separating insulating layer 140, the upper buffer insulating layer 150, the intermediate insulating layer 160, the upper gate insulating layer 170 and the upper interlayer insulating layer 180 may include a bezel source contact hole partially exposing the bezel source region of the bezel active pattern 251. The bezel source electrode 255 may be in direct contact with the bezel source region of the bezel active pattern 251 through the bezel source contact hole.

The bezel drain electrode 257 may include a conductive material. For example, the bezel drain electrode 227 may include a metal, such as aluminum (Al), chrome (Cr), copper (Cu), molybdenum (Mo), titanium (Ti) and tungsten (W). The bezel drain electrode 257 may include a same material as the first drain electrode 217 and the second drain electrode 227. The bezel drain electrode 257 may be disposed on a same layer as the first drain electrode 217 and the second drain electrode 227. For example, the bezel drain electrode 257 may be disposed between the upper interlayer insulating layer 180 and the planarization layer 190. The bezel drain electrode 257 may be formed simultaneously with the first drain electrode 217 and the second drain electrode 227.

The bezel drain electrode 257 may be electrically connected to the bezel drain region of the bezel active pattern 251. For example, the lower gate insulating layer 120, the lower interlayer insulating layer 130, the separating insulating layer 140, the upper buffer insulating layer 150, the intermediate insulating layer 160, the upper gate insulating layer 170 and the upper interlayer insulating layer 180 may include a bezel drain contact hole partially exposing the bezel drain region of the bezel active pattern 251. The bezel drain electrode 257 may be in direct contact with the bezel drain region of the bezel active pattern 251 through the bezel drain contact hole.

Figure 7:
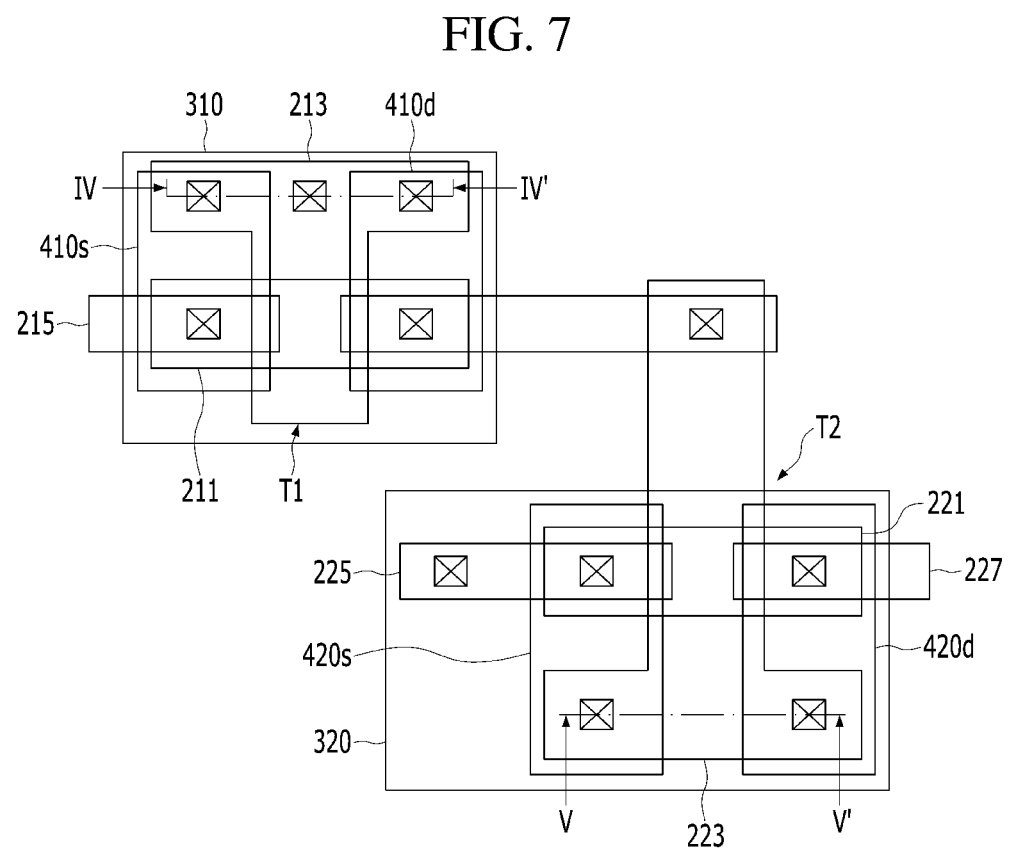
Figure 8:
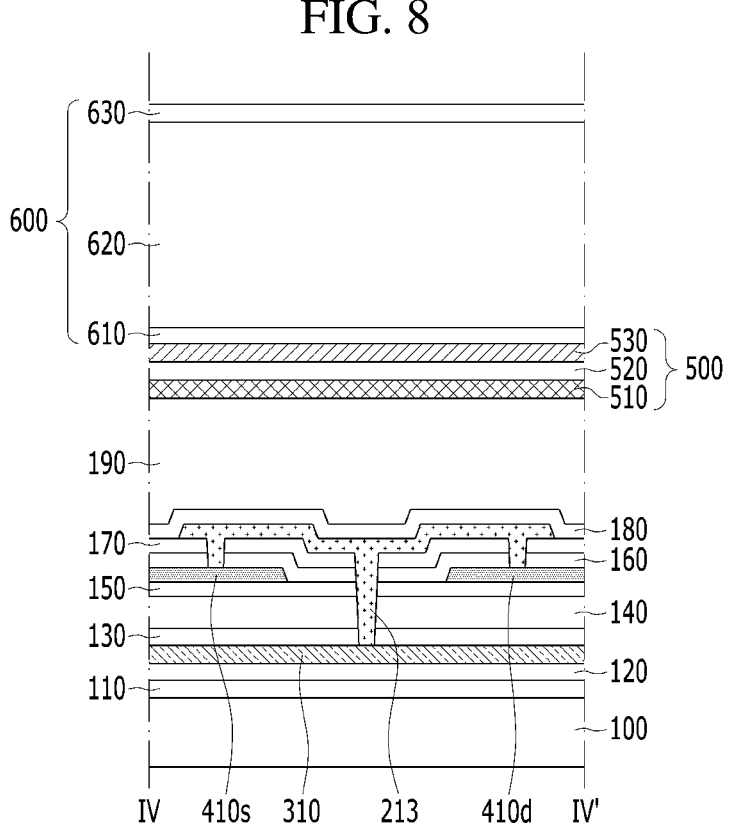
Figure 9:
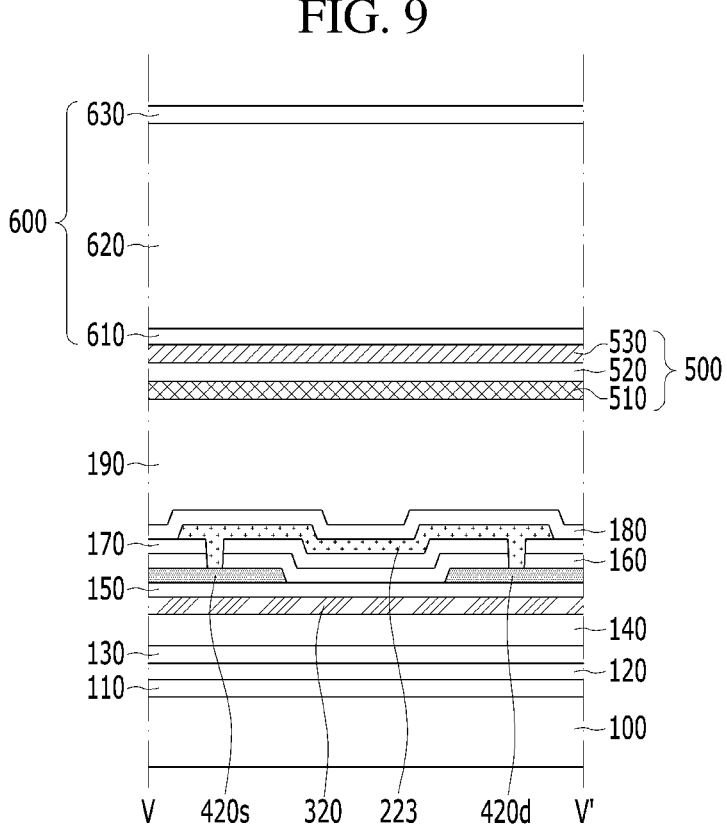

The display apparatus according to the first embodiment of the present disclosure is described that the source semiconductor patterns 410*s* and 420*s* and the drain semiconductor patterns 410*d* and 420*d* in each pixel area PA are in a floating state. However, in the display apparatus according to a second embodiment of the present disclosure, a specific voltage may be applied to the source semiconductor patterns 410*s* and 420*s* and the drain semiconductor patterns 410*d* and 420*d* in each pixel area PA. For example, in the display apparatus according to the second embodiment of the present disclosure, the first source semiconductor pattern 410*s* and the first drain semiconductor pattern 410*d* may be electrically connected to the first gate electrode 213 at the outside of the first active pattern 211, and the second source semiconductor pattern 420*s* and the second drain semiconductor pattern 420*d* may be electrically connected to the second gate electrode 223 at the outside of the second active pattern 221, as shown in FIGS. 7 to 9. Thus, in the display apparatus according to the second embodiment of the present disclosure, a change of the fermi lever due to the source semiconductor patterns 410*s* and 420*s* and the drain semiconductor patterns 410*d* and 420*d* may be maintained. That is, in the display apparatus according to the second embodiment of the present disclosure, a resistance of the source region 221*s* and a resistance of the drain region 221*d* in each pixel area PA may be maintained constant. Therefore, in the display apparatus according to the second embodiment of the present disclosure, reliability of the pixel driving circuit DC in each pixel area PA may be improved.

Figure 10:
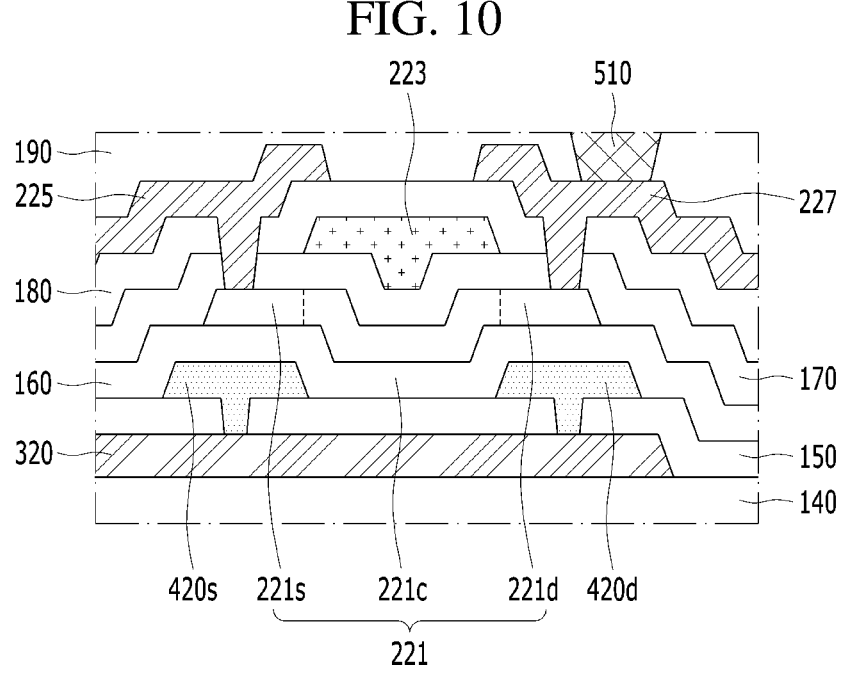
FIG. 10 is a view showing the display apparatus according to a third embodiment of the present disclosure.

In the display apparatus according to a third embodiment of the present disclosure, a constant voltage may be applied to the second source semiconductor pattern 420*s* and the second drain semiconductor pattern 420*d* of each pixel area PA. For example, in the display apparatus according to the third embodiment of the present disclosure, the second source semiconductor pattern 420*s* and the second drain semiconductor pattern 420*d* of each pixel area PA may be electrically connected to the second light-blocking pattern 320 of the corresponding pixel area PA, as shown in FIG. 10. Thus, in the display apparatus according to the third embodiment of the present disclosure, the second source semiconductor pattern 420*s* and the second drain semiconductor pattern 420*d* of each pixel area PA may be electrically connected to the power voltage supply line through the second source electrode 225 of the corresponding pixel area PA. That is, in the display apparatus according to the third embodiment of the present disclosure, the second active pattern 221 of the second thin film transistor functioning as a driving thin film transistor in each pixel area PA may have a certain electrical characteristics. Therefore, in the display apparatus according to the third embodiment of the present disclosure, a luminance deviation due to a minute change in the driving current generated by the second thin film transistor may be prevented or at least reduced.

Figure 11:
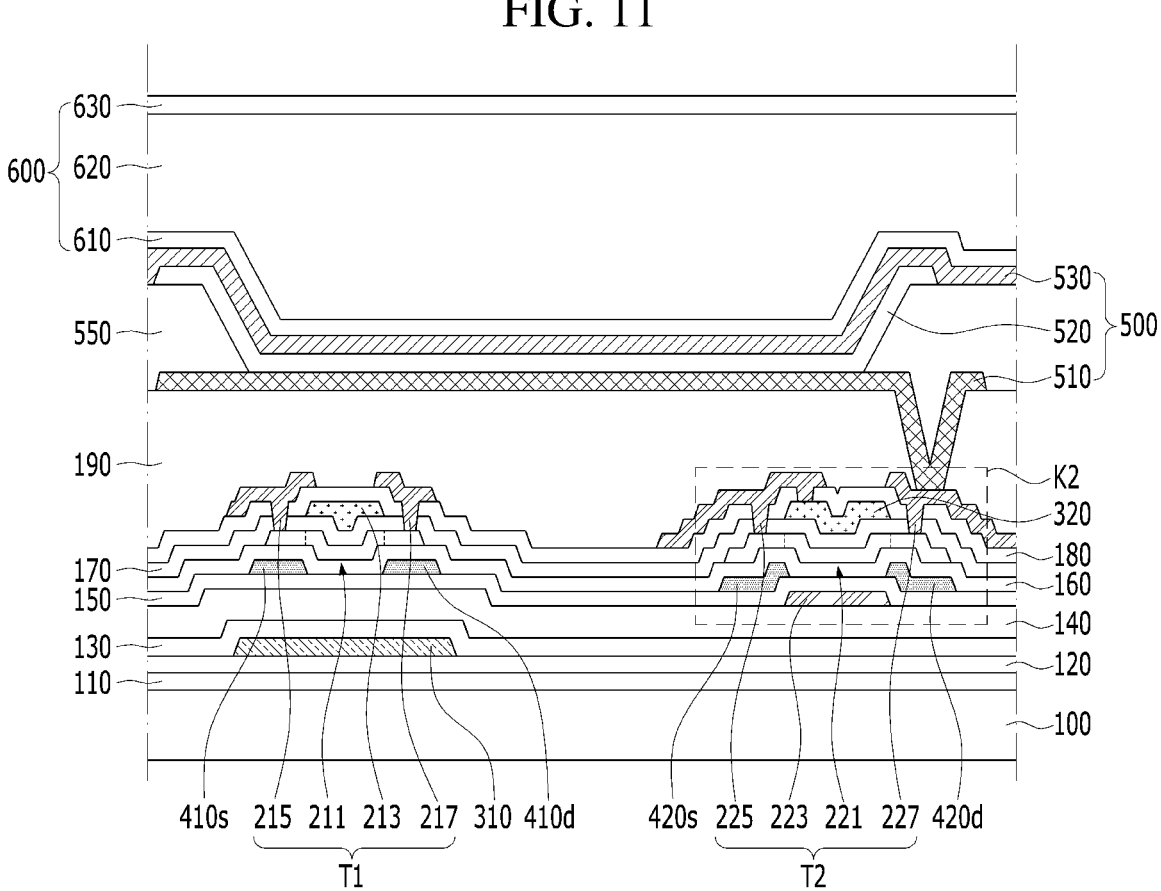
FIGS. 11 to 12 are views showing the display apparatus according to a fourth embodiment of the present disclosure.
Figures 12, 13:
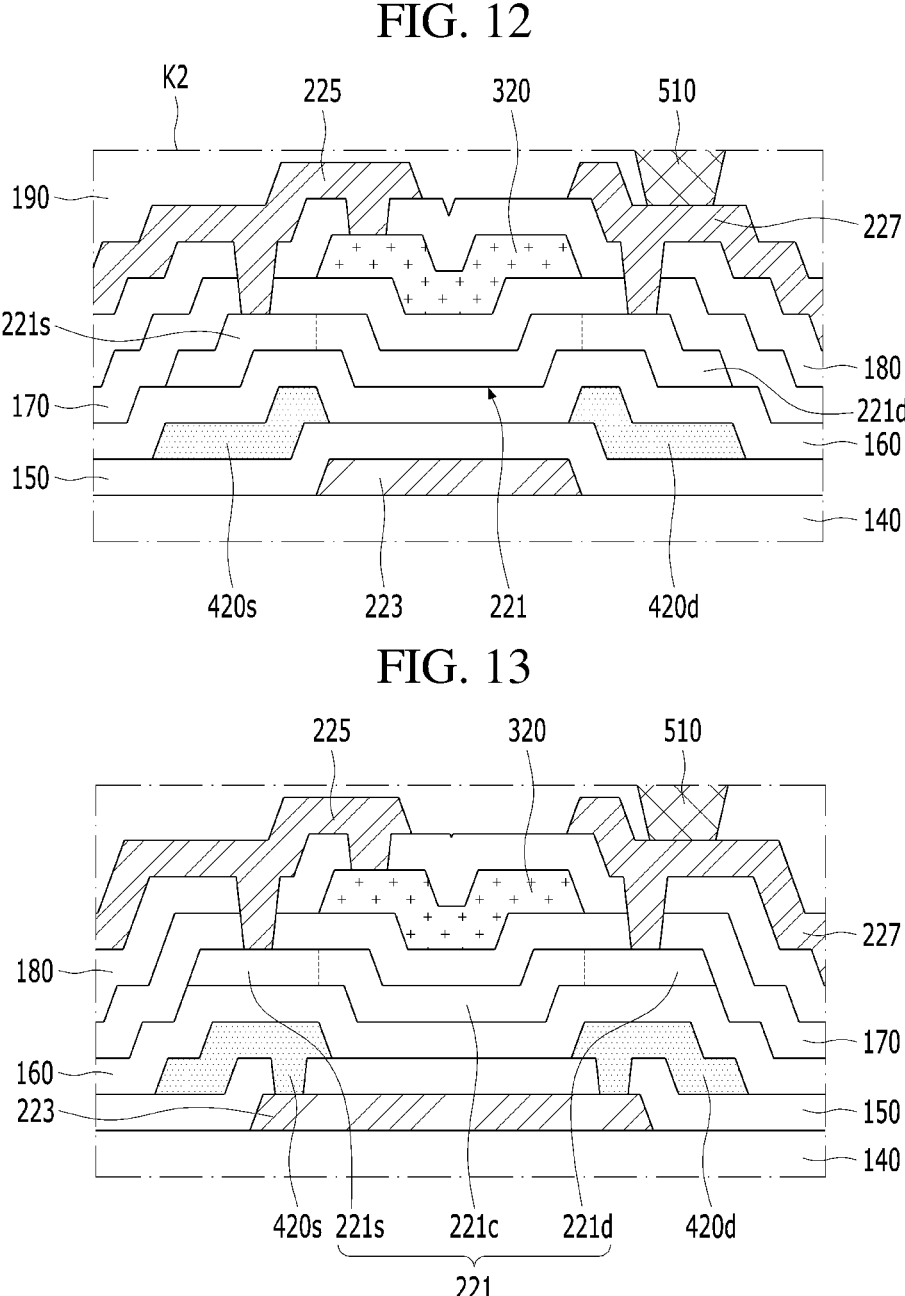
FIG. 13 is a view showing the display apparatus according to a fifth embodiment of the present disclosure.

The display apparatus according to the first embodiment of the present disclosure is described as the pixel driving circuit DC of each pixel area PA includes the thin film transistors T1 and T2 having a same structure. However, in the display apparatus according to a fourth embodiment of the present disclosure, the second thin film transistor T2 of each pixel area PA may have a structure different from the first thin film transistor T1 of the corresponding pixel area PA. For example, in the display apparatus according to the fourth embodiment of the present disclosure, the second gate electrode 223 of the second thin film transistor T2 in each pixel area PA may be disposed between the separating insulating layer 140 and the upper buffer insulating layer 150, as shown in FIGS. 11 and 12. A portion of the upper buffer insulating layer 150 and a portion of the intermediate insulating layer 160 between the second gate electrode 223 and the second active pattern 221 may function as a gate insulating layer of the second thin film transistor T2. The second gate electrode 223 may include a material different from the first gate electrode 213.

The second light-blocking pattern 320 may be disposed on a same layer as the first gate electrode 213. For example, the second light-blocking pattern 320 may be disposed between the upper gate insulating layer 170 and the upper interlayer insulating layer 180. The second light-blocking pattern 320 may include a same material as the first gate electrode 213. Thus, in the display apparatus according to the fourth embodiment of the present disclosure, a capacitance of a parasitic capacitor formed between the second light-blocking pattern 320 and the second active pattern 221 may be further increased. Therefore, in the display apparatus according to the fourth embodiment of the present disclosure, the occurrence of spot in the low grayscale may be effectively prevented or at least reduced.

In the display apparatus according to a fifth embodiment of the present disclosure, the second source semiconductor pattern 420*s* and the second drain semiconductor pattern 420*d* may be electrically connected to the second gate electrode 223 by penetrating the upper buffer insulating layer 150. For example, in the display apparatus according to the fifth embodiment of the present disclosure, an end portion of the second gate electrode 223 may overlap the second source semiconductor pattern 420*s*, and the other end portion of the second gate electrode 223 may overlap the second drain semiconductor pattern 420*d*, as shown in FIG. 13. Thus, in the display apparatus according to the fifth embodiment of the present disclosure, the degree of freedom for configuration of the first thin film transistor T1 and the second thin film transistor T2 in each pixel area PA may be improved.

Figure 14:
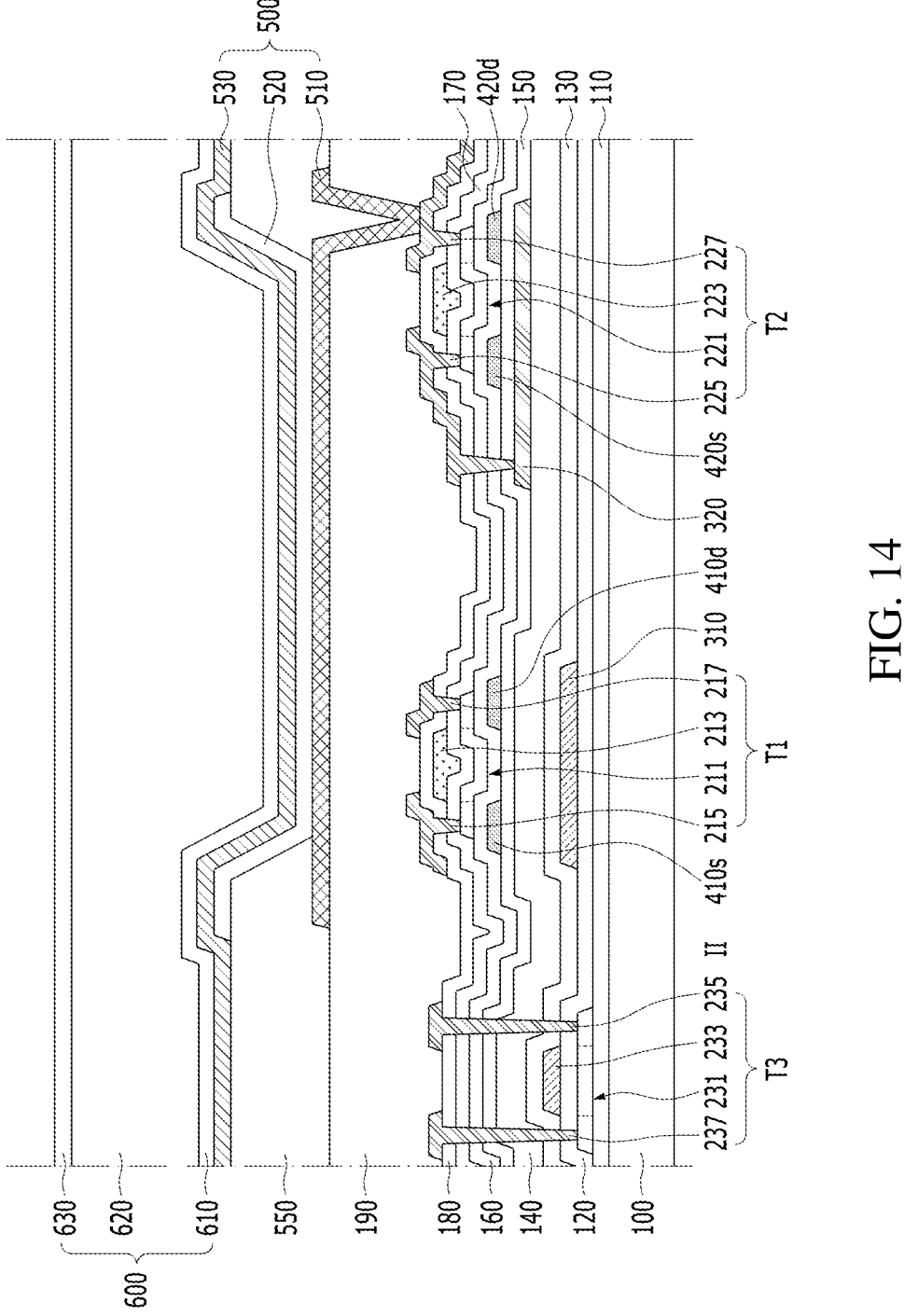
FIG. 14 is a view showing the display apparatus according to a sixth embodiment of the present disclosure.

The display apparatus according to the first embodiment of the present disclosure is described that each of the pixel areas PA includes two thin film transistors T1 and T2. However, in the display apparatus according to a sixth embodiment of the present disclosure, each of the pixel areas PA may include at least three thin film transistors T1 and T2. For example, in the display apparatus according to the sixth embodiment of the present disclosure, a third thin film transistor T3 spaced apart from the first thin film transistor T1 and the second thin film transistor T2 may be disposed in each pixel area PA, as shown in FIG. 14. Thus, in the display apparatus according to the sixth embodiment of the present disclosure, the degree of freedom for configuration of the pixel driving circuit in each pixel area PA may be improved.

The third thin film transistor T3 may have an electric characteristics different from the first thin film transistor T1 and the second thin film transistor T2. For example, a third active pattern 231 of the third thin film transistor T3 may include a low-temperature Poly-Si (LTPS). The third active pattern 231 may be disposed between the lower buffer insulating layer 110 and the lower gate insulating layer 120. A third gate electrode 233 of the third thin film transistor T3 may be disposed between the lower gate insulating layer 120 and the lower interlayer insulating layer 130. A third source electrode 235 and a third drain electrode 237 of the third thin film transistor T3 may be disposed between the upper interlayer insulating layer 180 and the planarization layer 190. Thus, in the display apparatus according to the sixth embodiment of the present disclosure, the pixel driving circuit of each pixel area PA may be configured by the thin film transistors T1, T2 and T3, which have various electric characteristics. Therefore, in the display apparatus according to the sixth embodiment of the present disclosure, the degree of freedom for configuration of the pixel driving circuit in each pixel area PA may be effectively improved.

In the result, the display apparatus according to the embodiments of the present disclosure may comprise the thin film transistor, the source semiconductor pattern and the drain semiconductor pattern, wherein the thin film transistor may include an active pattern made of an oxide semiconductor, the active pattern may include the source region overlapping with the source semiconductor pattern, the drain region overlapping with the drain semiconductor pattern, and the channel region between the source region and the drain region, and wherein the source semiconductor pattern and the drain semiconductor pattern including n-type impurities may be insulated from the active pattern by a first insulating layer. Thus, in the display apparatus according to the embodiments of the present disclosure, the source region and the drain region may have a resistance lower than the channel region, without physical damage and impurities doping. Thereby, in the display apparatus according to the embodiments of the present disclosure, a change in electric characteristics of the thin film transistor may be prevented or at least reduced, and the quality of the image may be improved.

What is claimed is:

1. A display apparatus comprising:
a device substrate;
a source semiconductor pattern on the device substrate, the source semiconductor pattern including n-type impurities;
a drain semiconductor pattern spaced apart from the source semiconductor pattern, the drain semiconductor pattern including n-type impurities;
a thin film transistor on the device substrate, the thin film transistor including an active pattern, the active pattern comprising an oxide semiconductor; and
a first insulating layer between the source semiconductor pattern and the active pattern and between the drain semiconductor pattern and the active pattern,
wherein the active pattern includes a source region overlapping with the source semiconductor pattern, a drain region overlapping with the drain semiconductor pattern, and a channel region between the source region and the drain region,
wherein the source region and the drain region have a material composition ratio same as the channel region, and
wherein a resistance of the source region and a resistance of the drain region are lower than a resistance of the channel region.

2. The display apparatus according to claim 1, further comprising a second insulating layer on the first insulating layer,
wherein the thin film transistor includes a gate electrode on the second insulating layer, the gate electrode overlapping with the channel region of the active pattern, and
wherein the active pattern is surrounded by the first insulating layer and the second insulating layer.

3. The display apparatus according to claim 2, wherein the active pattern is between the device substrate and the gate electrode.

4. The display apparatus according to claim 2, further comprising:
a buffer insulating layer between the device substrate and the source semiconductor pattern and between the device substrate and the drain semiconductor pattern; and
a light-blocking pattern between the device substrate and the buffer insulating layer, the light-blocking pattern overlapping with the active pattern,
wherein the source semiconductor pattern and the drain semiconductor pattern are electrically connected to the light-blocking pattern.

5. The display apparatus according to claim 4, wherein the thin film transistor further includes:
a source electrode electrically connected to the source region of the active pattern, and
a drain electrode electrically connected to the drain region of the active pattern,
wherein the light-blocking pattern is electrically connected to the source electrode of the thin film transistor.

6. A display apparatus comprising:
a first insulating layer on a device substrate;
a first thin film transistor on the first insulating layer, the first thin film transistor including:
a first active pattern comprising an oxide semiconductor, and
a first gate electrode overlapping with a channel region of the first active pattern;
a first source semiconductor pattern between the device substrate and the first insulating layer, the first source semiconductor pattern overlapping with a source region of the first active pattern;
a first drain semiconductor pattern between the device substrate and the first insulating layer, the first drain semiconductor pattern overlapping with a drain region of the first active pattern; and
a second insulating layer on the first insulating layer, the second insulating layer extending between the first active pattern and the first gate electrode,
wherein the first source semiconductor pattern includes n-type impurities, and
wherein the first gate electrode is electrically connected to the first source semiconductor pattern and the first drain semiconductor pattern.

7. The display apparatus according to claim 6, wherein the first drain semiconductor pattern includes same impurities as the first source semiconductor pattern.

8. The display apparatus according to claim 6, further comprising:
a buffer insulating layer between the device substrate and the first source semiconductor pattern and between the device substrate and the first drain semiconductor pattern; and
a first light-blocking pattern between the device substrate and the buffer insulating layer, the first light-blocking pattern overlapping with the first active pattern,
wherein the first light-blocking pattern is electrically connected to the first gate electrode of the first thin film transistor.

9. The display apparatus according to claim 8, wherein the first light-blocking pattern includes a material different from the first source semiconductor pattern and the first drain semiconductor pattern.

10. The display apparatus according to claim 8, further comprising:

a second thin film transistor spaced apart from the first thin film transistor, the second thin film transistor including:

a second active pattern comprising an oxide semiconductor, and a second gate electrode overlapping with a channel region of the second active pattern;

a second source semiconductor pattern insulated from the second active pattern, the second source semiconductor pattern overlapping with a source region of the second active pattern; and a second drain semiconductor pattern insulated from the second active pattern, the second drain semiconductor pattern overlapping with a drain region of the second active pattern, wherein the second source semiconductor pattern and the second drain semiconductor pattern include n-type impurities, and wherein the second gate electrode is electrically connected to the second source semiconductor pattern and the second drain semiconductor pattern.

11. The display apparatus according to claim 10, wherein the second source semiconductor pattern and the second drain semiconductor pattern are between the buffer insulating layer and the first insulating layer.

12. The display apparatus according to claim 10, wherein the second gate electrode is between the device substrate and the buffer insulating layer.

13. The display apparatus according to claim 12, wherein the second gate electrode is on a layer different from the first light-blocking pattern.

14. The display apparatus according to claim 12, further comprising a second light-blocking pattern on the second insulating layer, the second light-blocking pattern overlapping with the second active pattern, wherein the second light-blocking pattern includes a same material as the first gate electrode.

* * * * *